(12) United States Patent
Yamada et al.

(10) Patent No.: US 8,212,577 B2
(45) Date of Patent: Jul. 3, 2012

(54) NEEDLE TRACE TRANSFER MEMBER AND PROBE APPARATUS

(75) Inventors: Hiroshi Yamada, Nirasaki (JP);
Hirofumi Katagiri, Nirasaki (JP);
Tetsuji Watanabe, Nirasaki (JP);
Takeshi Kawaji, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 533 days.

(21) Appl. No.: 12/390,691

(22) Filed: Feb. 23, 2009

(65) Prior Publication Data
US 2009/0212804 A1 Aug. 27, 2009

(30) Foreign Application Priority Data
Feb. 23, 2008 (JP) ................................. 2008-042272

(51) Int. Cl.
*G01R 31/00* (2006.01)
(52) U.S. Cl. ........... 324/750.03; 324/754.03; 324/754.1; 324/755.01
(58) Field of Classification Search ............. 324/750.03, 324/754.03, 754.1, 755.01
See application file for complete search history.

(56) References Cited

U.S. PATENT DOCUMENTS

| | | | | |
|---|---|---|---|---|
| 5,968,282 A * | 10/1999 | Yamasaka | ......................... | 134/6 |
| 6,765,401 B2 * | 7/2004 | Hamada | ..................... | 324/750.1 |
| 6,906,543 B2 * | 6/2005 | Lou et al. | ................. | 324/750.08 |
| 7,009,415 B2 * | 3/2006 | Kobayashi et al. | ...... | 324/750.19 |
| 7,712,177 B2 | 5/2010 | Yoshida et al. | | |
| 7,772,862 B2 * | 8/2010 | Yamada et al. | ........... | 324/754.01 |
| 2006/0206146 A1 * | 9/2006 | Tenerz | ........................... | 606/213 |
| 2009/0092807 A1 * | 4/2009 | Hu et al. | ........................ | 428/215 |

FOREIGN PATENT DOCUMENTS

| | | |
|---|---|---|
| JP | 2004-304185 | 10/2004 |
| JP | 2005-79253 | 3/2005 |

OTHER PUBLICATIONS

Office Action issued Dec. 8, 2010 in Korea Application No. 2009-0014396 (With English Translation).

* cited by examiner

*Primary Examiner* — Arleen M Vazquez
(74) *Attorney, Agent, or Firm* — Oblon, Spivak, McClelland, Maier & Neustadt, L.L.P.

(57) ABSTRACT

A needle trace transfer member to which needle traces of probes are transferred is installed at a movable mounting table to align the probes before electrical characteristics of a target object on the mounting table are inspected by bringing the probes into electrical contact with the target object. The needle trace transfer member is made of a shape memory polymer transformed reversibly and rapidly between a glass state with a high modulus elasticity and a rubber state with a low modulus of elasticity near its glass transition temperature. The glass transition temperature is set to a temperature close to a set temperature of the mounting table. The shape memory polymer is mainly made of polyurethane-based resin.

12 Claims, 7 Drawing Sheets

NEEDLE TRACE TRANSFER MEMBER AND PROBE APPARATUS

FIELD OF THE INVENTION

The present invention relates to a member to which needle traces of probes are transferred (hereinafter, referred to as "needle trace transfer member") and a probe apparatus; and, more particularly, to a needle trace transfer member to which needle traces of probes are transferred to align the probes, and a probe apparatus having the needle trace transfer member when inspecting electrical characteristics of a target object by contacting the probes with the object

BACKGROUND OF THE INVENTION

When electrical characteristics of a target object such as a semiconductor wafer or the like are inspected by using a plurality of probes, the electrical characteristic inspection is performed by, e.g., imaging tips of the probes provided at a probe card by a camera, detecting tip positions of the probes and contacting the probes with electrode pads of the target object. When the tip positions of the probes are detected by using a camera, time is required to focus the camera on tips of the probes. As a result, considerable time is spent to align the target and the probe card. For this reason, in general, the alignment is not performed for all of the probes but performed by, e.g., selecting several representative probes.

However, in case where the electrode pads are miniaturized, the probes may not entirely contact with the respective electrode pads. Thus, it is preferable to detect the tip positions of all of the probes. Further, the probe card is not free from variations in production quality or the like, and even if the probe cards are of the same specification, the variations are hardly avoidable in the manufacturing process. This makes it necessary to detect the tips of the probes more precisely.

Moreover, various kinds of probe cards are developed by different probe card makers, so that there arises a need to develop dedicated algorithms for recognizing three-dimensional images of a plurality of probes. However, huge costs are incurred in developing such dedicated algorithms. Therefore, by transferring the probes to a two-dimensional film, the algorithms can be easily developed.

For example, Japanese Patent Laid-open Publication No. 2005-079253 discloses a method for detecting a tip status of probes by using a transfer sheet. In this method, needle traces are formed on the transfer sheet by bringing thermally expanded probes into pressure contact with a transfer sheet disposed on a support next to a mounting table. After the needle traces on the transfer sheet are detected, the alignment of the thermally expanded probes is carried out.

In the technique disclosed in Japanese Patent Laid-open Publication No. 2005-079253, the needle traces are formed on the transfer sheet to align the probes, and the formed needle traces are eliminated, for next alignment, by melting resin by heating the transfer sheet with the use of the heating unit. Since, however, the transfer sheet is made of thermoplastic resin, e.g., polyolefin-based resin or polyvinyl chloride-based resin or the like, the needle traces are not eliminated unless the transfer sheet is heated to, e.g., about 100 to 120° C., and maintained at this temperature for a specific period of time (e.g., about one minute), which decreases a throughput. Further, the transfer temperature of the transfer sheet should be adjusted to a temperature close to a room temperature. Therefore, the needle traces may be eliminated during the inspection performed at a high temperature above 100° C. Accordingly, it is difficult to use this method in the high temperature inspection. Even if this method is used, since the temperature of the transfer sheet is considerably lower than that of the mounting table, the large temperature difference between the transfer sheet and the mounting table may adversely affect the high-temperature inspection.

SUMMARY OF THE INVENTION

In view of the above, the present invention provides a needle trace transfer member which is capable of improving a throughput of inspection by eliminating needle traces in a short period of time and also capable of suppressing an effect of a temperature of the needle trace transfer member during high-temperature inspection, and a probe apparatus provided with the needle trace transferring member.

In accordance with a first aspect of the invention, there is provided a needle trace transfer member, installed at a movable mounting table, to which needle traces of probes are transferred to align the probes before electrical characteristics of a target object on the mounting table are inspected by bringing the probes into electrical contact with the target, wherein the needle trace transfer member is made of a shape memory polymer transformed reversibly and rapidly between a glass state with a high modulus elasticity and a rubber state with a low modulus of elasticity near its glass transition temperature.

It is preferable that the glass transition temperature is set to a temperature close to a set temperature of the mounting table.

Preferably, the shape memory polymer is mainly made of polyurethane-based resin.

In accordance with a second aspect of the invention, there is provided a probe apparatus for aligning a plurality of probes by picking up images of needle traces of the probes which are transferred to a needle trace transfer member on a support attached to a movable mounting table by an image pick-up device before electrical characteristics of a target object are inspected by bringing the probes disposed above the mounting table into electrical contact with the target object mounted on the mounting table, wherein the needle trace transfer member is made of a shape memory polymer transformed reversibly and rapidly between a glass state with a high modulus elasticity and a rubber state with a low modulus of elasticity near its glass transition temperature.

It is preferable that the glass transition temperature is set to a temperature close to a set temperature of the mounting table.

Preferably, the shape memory polymer is mainly made of polyurethane-based resin.

Preferably, the support has a temperature control unit for controlling a temperature of the shape memory polymer.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Hereinafter, an embodiment of the present invention will be described with reference to FIGS. 1 to 7.

Figure 1:
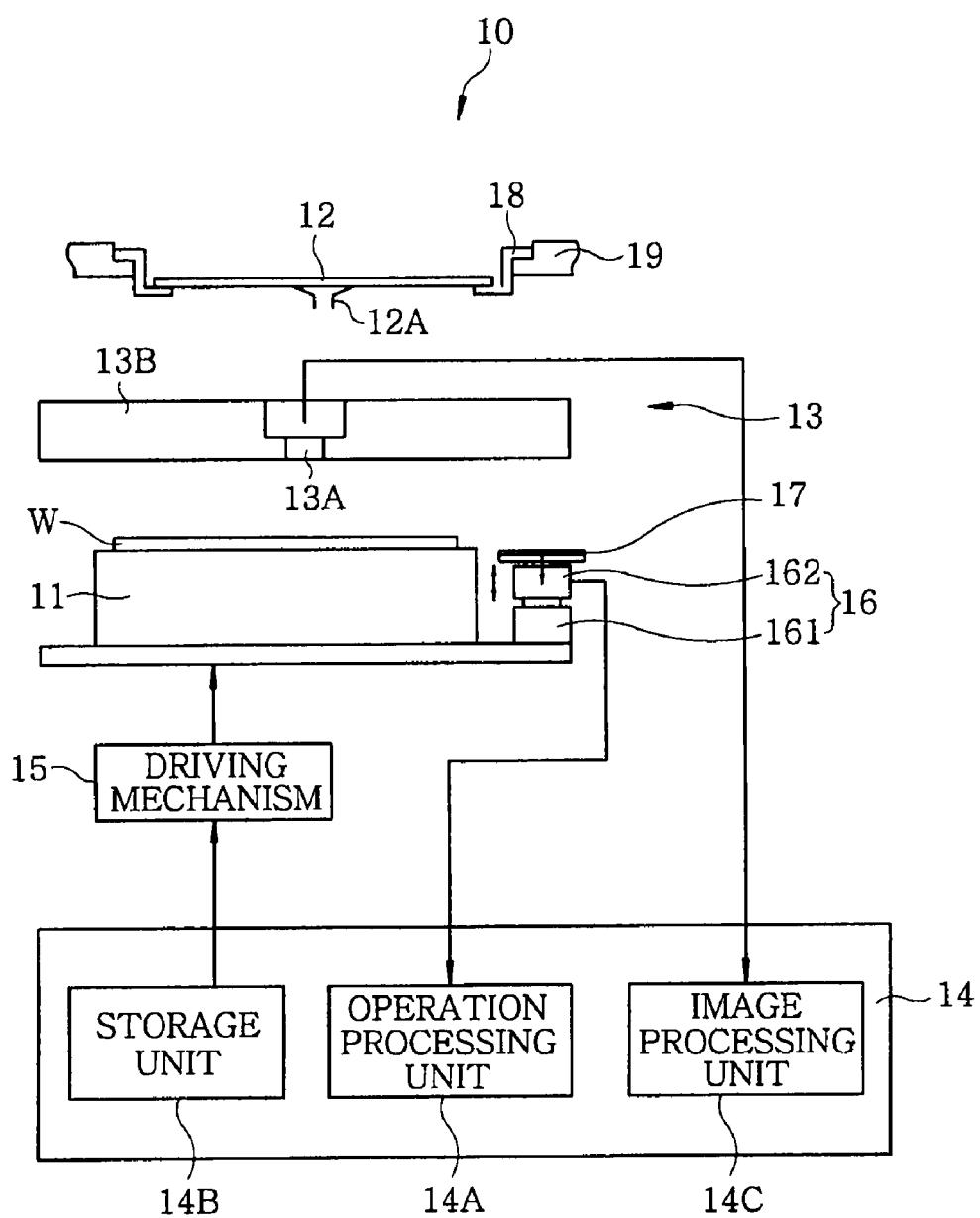
FIG. 1 shows a probe apparatus in accordance with an embodiment of the present invention.

Above all, a probe apparatus of the present embodiment will be described with reference to, e.g., FIG. 1. As shown in FIG. 1, the probe apparatus 10 of the present embodiment includes a movable wafer chuck 11 for mounting thereon a target object (semiconductor wafer) W, a probe card 12 arranged above the wafer chuck 11, an alignment mechanism 13 for aligning a plurality of probes 12A of the probe card 12 with the semiconductor wafer W mounted on the wafer chuck 11, and a control unit 14 for controlling the wafer chuck 11, the alignment mechanism 13 and the like. Under the control of the control unit 14, the alignment mechanism 13 is driven to align the semiconductor wafer W mounted on the wafer chuck 11 and the probes 12A of the probe card 12. Subsequently, the electrical characteristics inspection of the semiconductor wafer W are conducted by brining the probes 12A into electrical contact with electrode pads of the semiconductor wafer W corresponding to the probes 12A.

The wafer chuck 11 is configured to move in X, Y, Z and θ directions by a driving mechanism 15 operated under the control of the control unit 14. A tip position detecting device 16 is arranged at one side of the wafer chuck 11. The tip position detecting device 16 is configured to detect tip positions of the probes 12A by transferring the tip positions of probes 12A a the needle trace transfer member 17 of the present embodiment to thereby align the probes 12A.

As shown in FIG. 1, the needle trace transfer member 17 of the present embodiment is positioned at one side of the wafer chuck 11, and is used to align the probes 12A. In the present embodiment, the needle trace transfer member 17 is supported by a support body installed at the side of the wafer chuck 11 so as to be movable by the tip position detecting device 16, as illustrated in FIG. 1. The tip position detecting device 16 raises the needle trace transfer member 17 to a predetermined height during the alignment of the probes 12A, as described in FIG. 2A so that needle traces 17A are formed on the needle trace transfer member 17. When the probes 12A become away from the needle trace transfer member 17, the needle traces 17A are formed on the needle trace transfer member 17 in correspondence to the arrangement of the probes 12A, and images of the needle traces 17A are picked up by the CCD camera 13A, as depicted in FIG. 2B. The image thus picked up makes it possible to obtain XY coordinates of the probes 12A. As illustrated in FIG. 2C, the needle traces 17A are eliminated by heating the needle trace transfer member 17 to a predetermined temperature, so that the needle trace transfer member 17 can be repetitively used as will be described later. Moreover, only a part of a contact body to be described later in the tip position detecting device 16 is illustrated in FIGS. 2A to 2C.

Figure 2A:
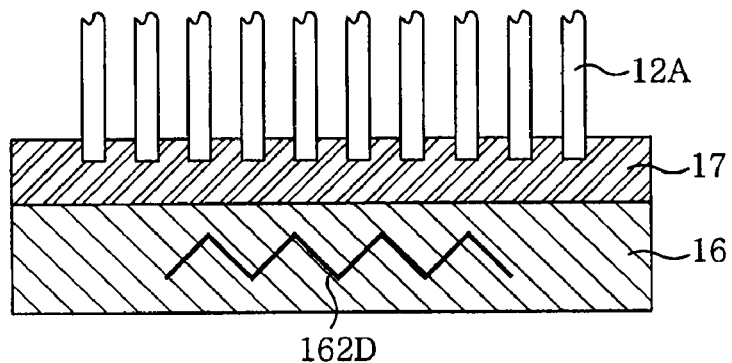
FIGS. 2A to 2C are explanatory views describing a process for forming needle traces on a needle trace transfer member by probes employed in the probe apparatus shown in FIG. 1 and eliminating the needle traces.
Figure 2B:
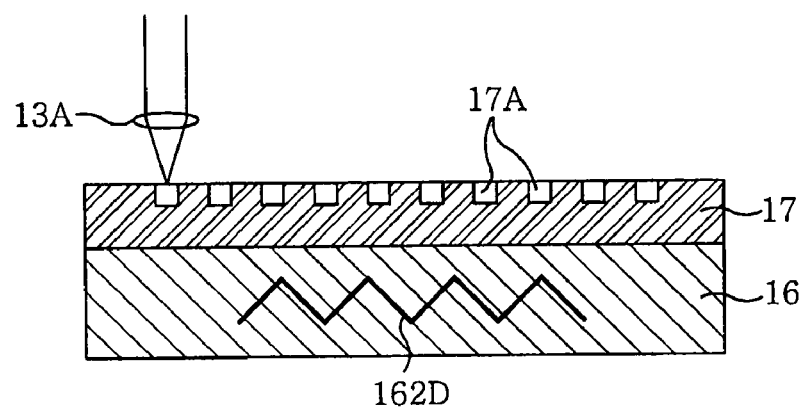
Figure 2C:
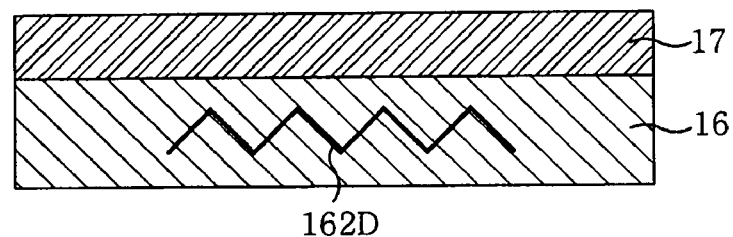

In other words, the needle trace transfer member 17 is disposed on the tip position detecting device 16, as shown in FIGS. 2A to 2C. The needle trace transfer member 17 is made of a shape memory polymer that is reversibly and rapidly transformed between a glass state with a high modulus elasticity and a rubber state with a low modulus elasticity near its glass transition temperature TG. When the needle trace transfer member 17 is within a temperature range of the glass state, needle traces of the probes 12A are transferred to the top surface of the member for transferring needle traces 17, as can be seen from FIG. 2A. Since the needle traces are formed on the needle trace transfer member 17 in the glass state with a high modulus of elasticity, the shape of the needle traces 17A can be maintained as long as the glass state is maintained. If the needle trace transfer member 17 is heated to a temperature higher than or equal to the glass transition temperature TG and becomes within the temperature range of the rubber state with a low modulus of elasticity, the needle traces 17A are eliminated in a short period of time. Accordingly, the needle trace transfer member 17 can be recovered to have a flat surface.

Figure 3:
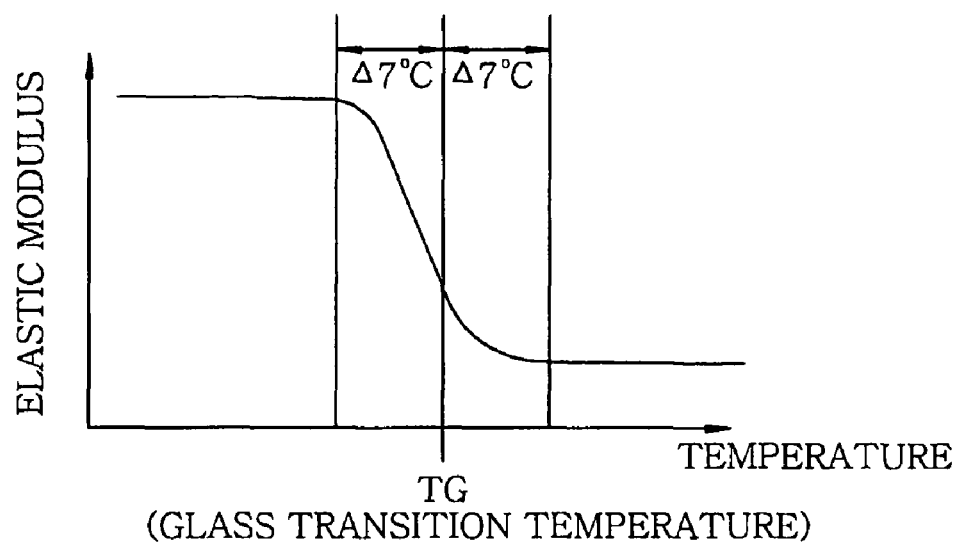
FIG. 3 provides a graph illustrating a relationship between a modulus of elasticity and a temperature of a shape memory polymer used in the needle trace transfer member.

The glass transition temperature TG can be properly adjusted within a large temperature range by a unit of, e.g., 1° C. For example, it is properly set between about 25 to 150° C. based on an inspection temperature of a semiconductor wafer W. The shape memory polymer used in the needle trace transfer member 17 of the present embodiment is not particularly limited, and may be, e.g., polyurethane-based resin, polynorbornen-based resin, polyisoprene-based resin or the like. In the present embodiment, it is preferable to use polyurethane-based resin as a shape memory polymer. As shown in FIG. 3, when the needle trace transfer member 17 is made of polyurethane-based resin as a shape memory polymer, the shape memory polymer is transformed reversibly and rapidly between a glass state and a rubber state within a temperature range of ±7° C. of the glass transition temperature TG.

Accordingly, in the case of the high-temperature inspection, the glass transition temperature TG is set to a temperature close to a set temperature of the wafer chuck 11. By properly selecting the shape memory polymer having such glass transition temperature TG, the needle traces 17A of the probes 12A are formed in needle trace transfer member 17 of the glass state at a temperature lower than but close to a temperature of the wafer chuck 11, and then are eliminated in a short period of time in the rubber state at a temperature that is higher than but close to the temperature of the wafer chuck 11. Namely, since the needle trace transfer member 17 is made of a shape memory polymer, a temperature at which the needle traces 17A are formed and a temperature at which the needle traces 17A are eliminated can be set within a narrow temperature range including the glass transition temperature TG. In addition, it is possible to suppress the affect of the temperature during the high-temperature inspection of the semiconductor wafer W. Besides, the needle trace transfer member 17 can be recovered to have a flat surface in an extremely short period of time by increasing the temperature from the point at which the needle traces 17A are formed to the point at which the needle traces 17A are eliminated and, further, the throughput of the inspection can be improved greatly.

To be more specific, the needle traces 17A of the probes 12A are preferably transferred to a shape memory polymer at a temperature (T=TG−15° C.) lower than the glass transition temperature TG of the shape memory polymer by, e.g., about 15° C. The temperature lower than the glass transition temperature TG is properly changed depending on types of shape memory polymers. In addition, it can be set to a temperature close to the glass transition temperature TG, having smaller difference than 15° C. If the temperature at which the needle traces are transferred is lower than the glass transition temperature by 15° C. or more, the affect of the temperature of the tip position detecting device 16 may deteriorate the in-plane temperature uniformity of the semiconductor wafer W on the wafer chuck 11 and the reliability of the inspection. Moreover, the temperature at which the needle traces 17A are transferred can be properly changed by adjusting the components of the shape memory polymer in accordance with types of the probes 12A, so that the optimal modulus of elasticity of the needle trace transfer member 17 can be obtained and, also, the needle traces 17A can be easily formed in accordance with types of the probes 12A.

As shown in FIG. 1, the needle trace transfer member 17 is provided near the wafer chuck 11, so that the glass transition temperature of the shape memory polymer is preferably as close as possible to the temperature of the wafer chuck 11, as described above. When the semiconductor wafer W is inspected at a high temperature higher than or equal to about 100° C., it is preferable to use a shape memory polymer having a glass transition temperature TG higher than or equal to 100° C. as the temperature of the wafer chuck 11 at this time. By setting the glass transition temperature TG of the needle trace transfer member 17 close to the temperature of the wafer chuck 11, the high-temperature inspection of the semiconductor wafer W can be less affected by the temperature difference between the temperature of the wafer chuck 11 and the temperature of the needle trace transfer member 17 at which the needle traces 17A are formed.

The needle traces 17A formed on the needle trace transfer member 17 are maintained at a temperature lower than the glass transition temperature TG due to the high modulus of elasticity of the shape memory polymer. Therefore, the images of the needle traces 17A can be easily detected by the CCD camera 13A, as illustrated in FIG. 2B. As a consequence, the XY coordinates of the probes 12A can be detected with high accuracy.

As shown in FIG. 2C, the needle traces 17A formed on the needle trace transfer member 17 are eliminated in a short period of time by heating the shape memory polymer to a temperature higher than the glass transition temperature TG with the use of a heater of the tip position detecting device 16, thereby recovering the original flat surface of the needle trace transfer member 17. In the case of conventional polyolefin or polyvinyl chloride, the needle traces cannot be eliminated unless a state where the resin is melted by heating it from a temperature close to a room temperature at which the needle traces are formed to about 100 to 120° C. is maintained for more than one minute, thereby inhibiting the improvement of the throughput. On the contrary, in the case of the shape memory polymer, the throughput can be improved because the needle traces 17A are eliminated in a short period of time by heating the shape memory polymer from a temperature slightly lower than the temperature of the wafer chuck 11 to a temperature slightly higher than the glass transition temperature TG.

The probe card 12 is attached to a head plate 19 in a probe chamber via a card holder 18. In a state where the probes 12A are brought into electrical contact with the electrode pads of the semiconductor wafer W corresponding thereto, the electrical characteristics of the semiconductor wafer W are inspected based on signals supplied from a tester (not shown).

Further, as illustrated in FIG. 1, the alignment mechanism 13 includes an imaging unit (CCD camera) 13A and an alignment bridge 13B for supporting the CCD camera 13A, the alignment bridge 13B being movable back and forth. Under the control of the control unit 14, the CCD camera 13A moves from a wait position to a position directly below the center of the probe card 12 (hereinafter referred to as a "probe center") by the alignment bridge 13B. Then, the CCD camera 13A stops at that position. While the wafer chuck 11 is moving in the X and Y directions during an alignment process, the CCD camera 13A positioned at the probe center picks up images of the electrode pads of the semiconductor wafer W supported on the wafer chuck 11 from above. The picked-up images are processed in an image processing unit 14C and displayed on a display screen (not shown). As will be described later, the CCD camera 13A also picks up an image of the tip position detecting device 16 attached to the wafer chuck 11. The picked-up image is processed and displayed on the display screen.

Moreover, as depicted in FIG. 1, the control unit 14 includes an operation unit 14A, a storage unit 14B, and the aforementioned image processing unit 14C. The probe apparatus 10 is controlled by various programs stored in the storage unit 14B. A program for performing the inspection including the alignment of the semiconductor wafer W and the probes is stored in the storage unit 14B.

Figure 4:
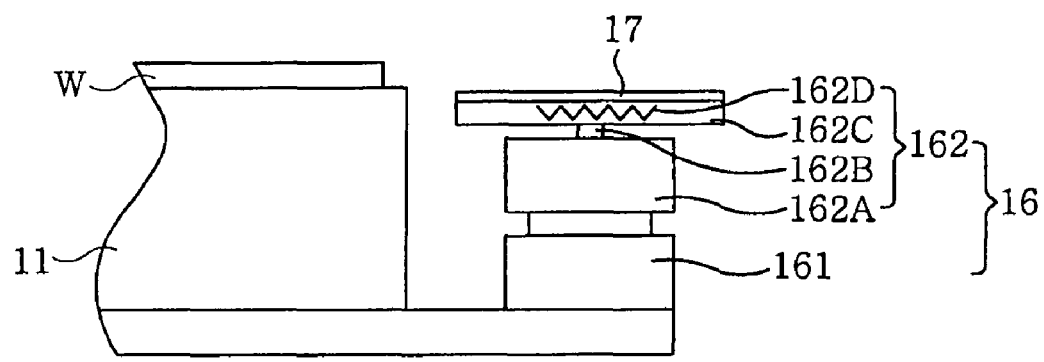
FIG. 4 presents a side view depicting a tip position detecting device having the needle trace transfer member.

As depicted in FIGS. 1 and 4, the tip position detecting device 16 having the needle trace transfer member 17 includes an elevation driving mechanism 161 such as an air cylinder or the like and a sensor mechanism 162 moved up and down by the elevation driving mechanism 161. In order to detect the tip positions of the probes 12A, the elevation driving mechanism 161 raises up the sensor mechanism 162 from the wait position to a height substantially equal to the top surface of the semiconductor wafer W supported on the wafer chuck 11.

As shown in FIG. 4, the sensor mechanism 162 includes a sensor unit 162A having a cylinder mechanism and serving as a displacement sensor, and a contact body 162C attached to the top end of a piston rod 162B included in the cylinder mechanism of the sensor unit 162A and kept in a position raised from the sensor unit 162A. A pressure applying unit (not shown) such as a compressed air source or the like supplies compressed air into a cylinder of the sensor unit 162A, to thereby apply a specified pressure to the contact body 162C through a piston (not shown) in the cylinder. Further, a sheet-like needle trace transfer member 17 is detachably attached to a top surface of the contact body 162C, and the needle traces 17A of the probes 12A are transferred to the needle trace transfer member 17, as described above.

Further, as shown in FIG. 4, a heater 162D is provided in the contact body 162C. The heater 162D heats the needle trace transfer member 17 to a temperature higher than the glass transition temperature TG of the shape memory polymer, thereby eliminating the needle traces of the probes 12A. This makes it possible to use the needle trace transfer member 17 repeatedly.

A fixing plate (not shown) is attached to the bottom end of the piston rod 162B. The contact body 162C is resiliently held by the sensor unit 162A via the fixing plate constantly in a raised position spaced apart from the sensor unit 162A at a predetermined distance. The gap left between the contact body 162C and the sensor unit 162A becomes a movable range of the contact body 162C. The distance of the gap is detected by the sensor unit 162A, and the position of the contact body 162C is constantly monitored by the sensor unit 162*a*.

The pressure applying unit is designed to switch over a first and a second pressure. The first pressure denotes a pressure which is set when detecting the tip heights of the probes 12A. The first pressure is set to be lower than the second pressure. The second pressure refers to a pressure which is set when the needle traces of the probes 12A are transferred to the top surface of the needle trace transfer member 17 during an alignment process.

The sensor unit 162A is provided with a pressure regulating unit (not shown) such as a constant pressure valve for keeping the first or second pressure constant. When the contact body 162C is moved down toward the sensor unit 162A, the pressure regulating unit gradually discharges the pressurized air to thereby keep the first pressure constant.

In a state where the contact body 162C is kept in place by at the first pressure, the tip position detecting device 16 is raised up through the movement of the wafer chuck 11 and the contact body 162C makes contact with the probes 12A via the needle trace transfer member 17. At this time the contact body 162C is moved down toward the sensor unit 162A while keeping the initial tip positions of the probes 12A without elastic deformation of the probes 12A. In a state where the contact body 162C is kept in place by the first pressure, the probes 12A apply a force of, e.g., 0.5 gf per probe, on the needle trace transfer member 17. Even if the probe pressure is applied from the probes 12A during the contact at the first pressure, so needle trace is not formed on the needle trace transfer member 17.

In a state where the contact body 162C is kept in place by at the second pressure, the contact body 162C is not moved down toward the sensor unit 162A, and is maintained in the initial position even if the probe pressure is applied to the needle trace transfer member 17 by the probes 12A. Therefore, the probes 12A transfer needle traces to the top surface of the needle trace transfer member 17.

Next, the operation of the probe apparatus 10 to which the needle trace transfer member 17 is employed will be described with reference to FIGS. 5 to 7.

First, the semiconductor wafer W is placed on the wafer chuck 11. In order to perform the high-temperature inspection of the semiconductor wafer W, the semiconductor wafer W is heated to a predetermined temperature by a temperature control mechanism installed in the wafer chuck 11. Further, the wafer chuck 11 moves in XY directions, and the tip positions of the probes 12A of the probe card 12 are detected by using the alignment mechanism 13 and the tip position detecting device 16. To do so, the CCD camera 13A of the alignment mechanism 13 moves to the probe center, i.e., a position directly below the center of the probe card 12, via the alignment bridge 13B. Next, while the wafer chuck 11 is moving under the alignment bridge 13B, the tip position detecting device 16 allows the elevation driving mechanism 161 to raise the sensor mechanism 162 as indicated by an arrow in FIG. 5B from the wait position illustrated in FIG. 5A. Therefore, the top surface of the needle trace transfer member 17 placed on the contact body 162C is positioned at a level substantially the same as the top surface of the semiconductor wafer W supported on the wafer chuck 11. At this time, in the tip position detecting device 16, the needle trace transfer member 17 is heated by the heater 162D (see FIGS. 2 and 4) installed in the contact body 162C to a temperature close to the temperature of the wafer chuck 11 which is lower than the glass transition temperature TG by, e.g., about 15° C.

Figure 5A:
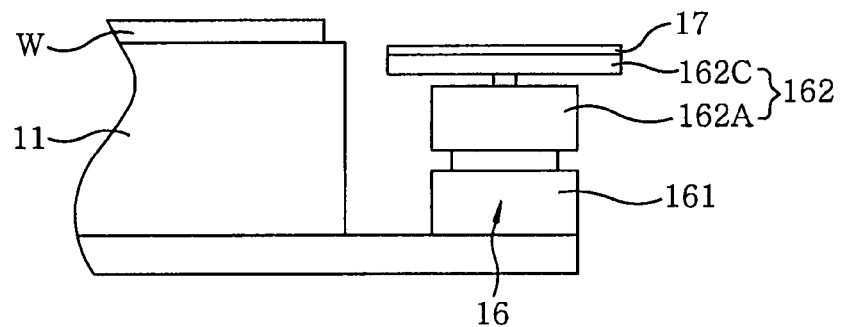
FIGS. 5A to 5C offer explanatory views describing a process for aligning the probes by using the needle trace transfer member.
Figure 5B:
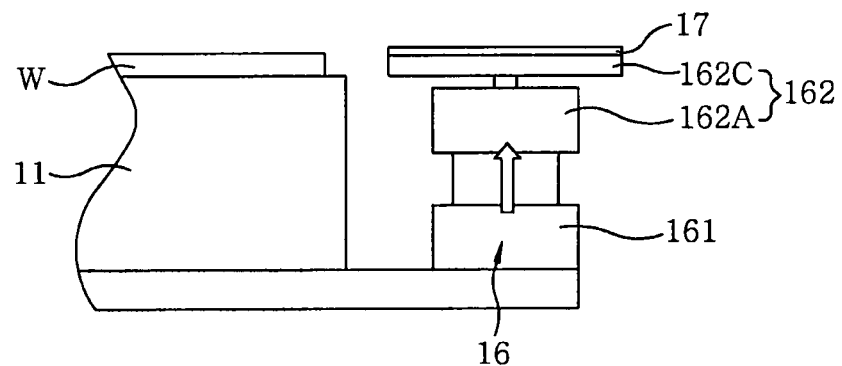
Figure 5C:
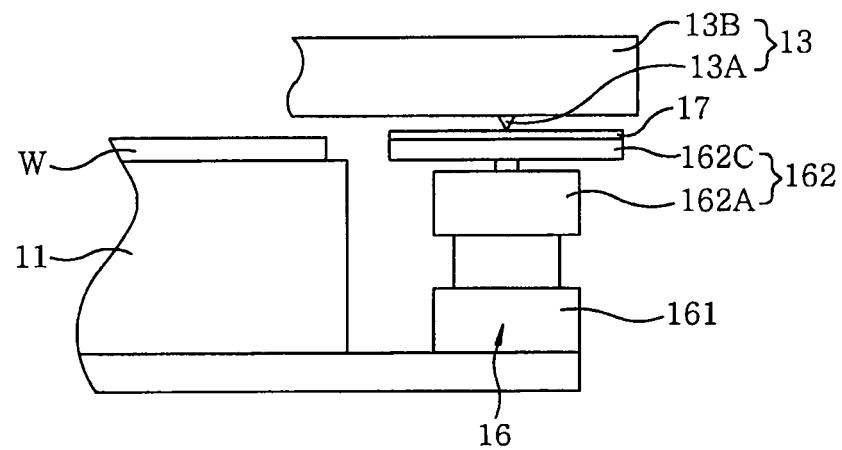

Thereafter, the wafer chuck 11 moves in the X and Y directions, so that the contact body 162C reaches a position directly below the CCD camera 13A as illustrated in FIG. 5C. Then, the CCD camera 13A detects the height of the top surface of the needle trace transfer member 17. After the height of the top surface of the needle trace transfer member 17 is detected, it is confirmed whether the sensor mechanism 162 normally operates. Once the normal operation of the sensor mechanism 162 is confirmed, the tip positions of the probes 12A are detected.

Figure 6A:
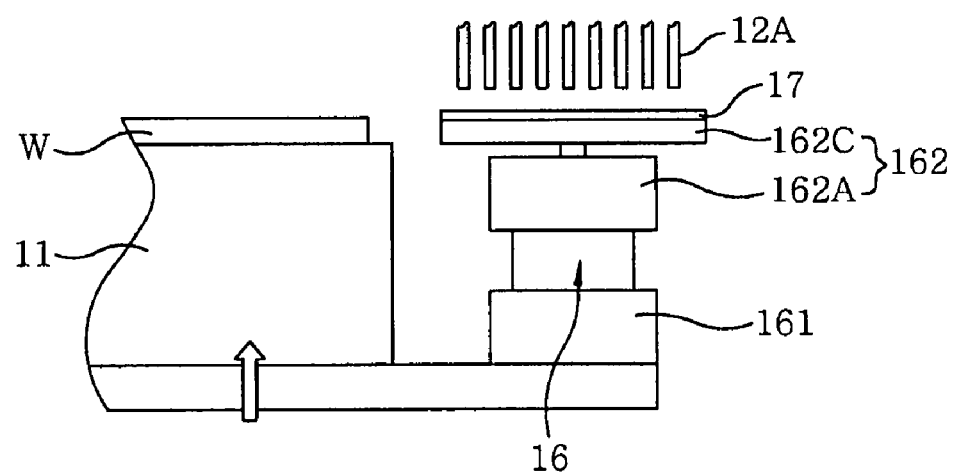
FIGS. 6A to 6D are flow charts showing processes continued from the processes shown in FIGS. 5A to 5C.
Figure 6B:
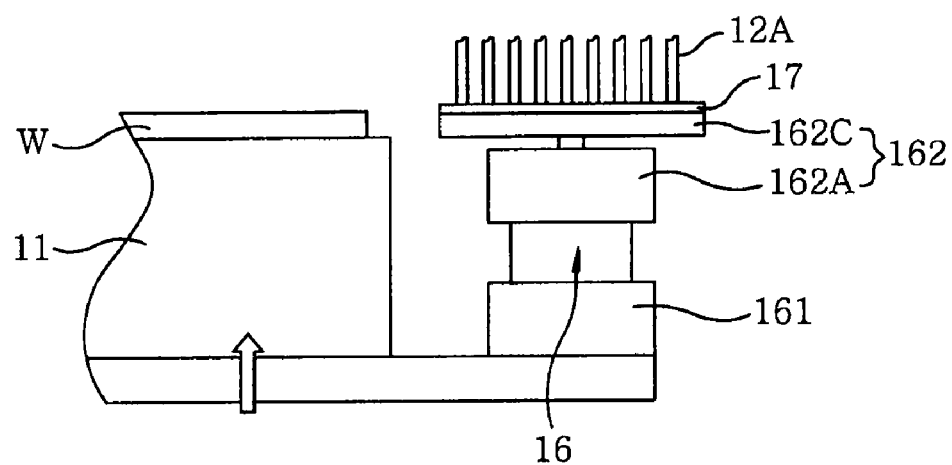
Figure 7:
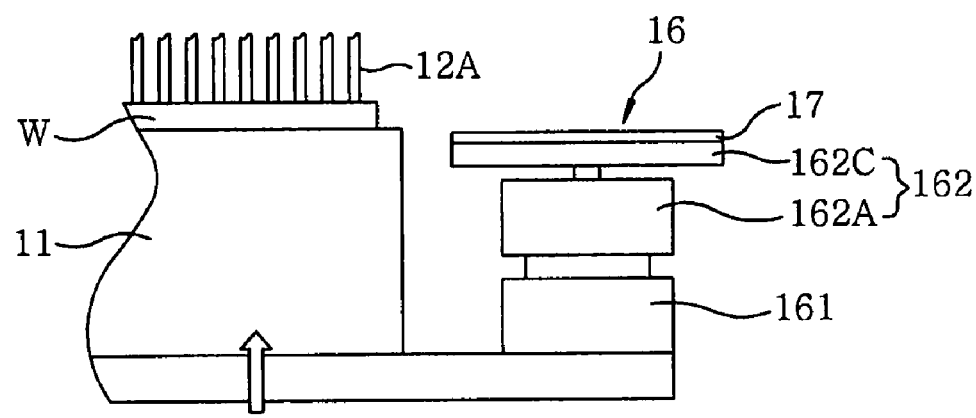
FIG. 7 is an explanatory view illustrating a process for performing inspection by bringing the probes into electrical contact with a semiconductor wafer after the alignment.

In order to detect the tip positions of the probes 12A, the alignment bridge 13B is retreated to the wait position and, then, the wafer chuck 11 moves up from the Z-direction reference position as shown in FIG. 6A. Then, the needle trace transfer member 17 of the tip position detecting device 16 comes close to and makes contact with the probes 12A. If the wafer chuck 11 further moves up, the contact body 162C is pressed by the probes 12A via the needle trace transfer member 17 and moved down toward the sensor unit 162A. At this time, the contact body 162C is resiliently held under the first pressure. Therefore, even if the probe pressure is applied from the probes 12A to the needle trace transfer member 17, the probes 12A neither undergo elastic deformation nor cause damage to the needle trace transfer member 17 (nor transfer the needle traces to the needle trace transfer member 17). In other words, in response to the upward movement of the wafer chuck 11, the contact body 162C moves down toward the sensor unit 162A by a distance corresponding to the upward movement of the wafer chuck 11 while keeping at the first pressure, thereby reducing the gap between the sensor unit 162A and the contact body 162C.

At this time, the sensor unit 162A monitors the distance between itself and the contact body 162C. If the gap between the sensor unit 162A and the contact body 162C is changed by the downward movement of the contact body 162C, the sensor unit 162A detects the length of the gap and transmits a detection signal to the control unit 14. Accordingly, the control unit 14 compares the value detected by the sensor unit 162A with an initial gap value preset in the operation unit 14A. Based on the upward movement distance from the reference position of the wafer chuck 11 until the moment when the detection value becomes smaller than the initial value, the control unit 14 calculates the height of the top surface of the needle trace transfer member 17, i.e., the height of the tip positions of the probes 12A. In this manner, the contact body 162C begins to move down with no elastic deformation of the probes 12A and without causing damage to the needle trace transfer member 17. Therefore, it is possible to highly accurately detect the downward movement starting position of the contact body 162C as the tip height of the probes 12A. The tip height of the probes 12A thus detected is stored as Z-coordinate data in the storage unit 14B of the control unit 14.

Thereafter, the wafer chuck 11 is returned to the Z-direction reference position. Next, the pressure applied to the contact body 162C is switched over from the first pressure to the second pressure. As indicated by an arrow in FIG. 6B, the wafer chuck 11 is moved up to bring the needle trace transfer member 17 into contact with the probes 12A and is then overdriven. Even if the wafer chuck 11 is overdriven, the contact body 162C is kept in place by under the second pressure and thus stays in its initial position without moving down toward the sensor unit 162A. As a consequence, the probes 12A are stuck into the needle trace transfer member 17 as shown in FIG. 2A, and needle traces 17A are transferred to the top surface of the needle trace transfer member 17 as depicted in FIG. 2B. At this time, the shape memory polymer is in the glass state, and the needle traces 17A (see FIG. 2B) are maintained.

Further, there is an alternative method for forming the needle traces 17A on the top surface of the needle trace transfer member 17. For example, the needle traces 17A can be formed on the needle trace transfer member 17 by switching the first pressure to the second pressure and returning the contact body 162C to the initial position in a state where the tip heights of the probes 12A are detected.

Figure 6C:
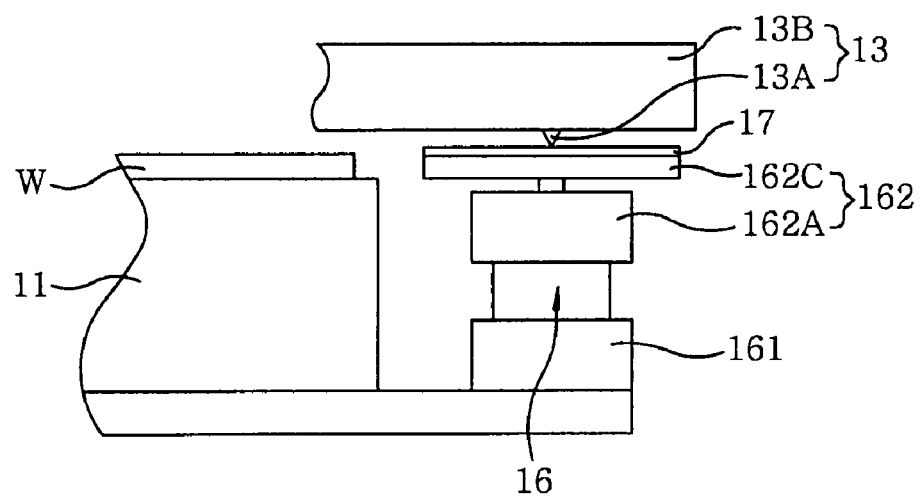

After the needle traces 17A are transferred to the needle trace transfer member 17 in the above-described manner, the wafer chuck 11 is moved down to the reference position. Then, the CCD camera 13A is moved to the probe center via the alignment bridge 13B, and the wafer chuck 11 is raised from the reference position. As illustrated in FIG. 6C, the CCD camera 13A detects the needle traces 17A left in the needle trace transfer member 17 (see FIG. 2B). Accordingly, it is possible to detect a plurality of XY positions or, if necessary, all of the XY positions of the probes 12A. The XY-coordinate data thus obtained is stored in the storage unit 14B. The tip positions, i.e., the XYZ-coordinate data, of the probes 12A are obtained through the series of aforementioned operations and used in aligning the semiconductor wafer W and the probes 12A.

Figure 6D:
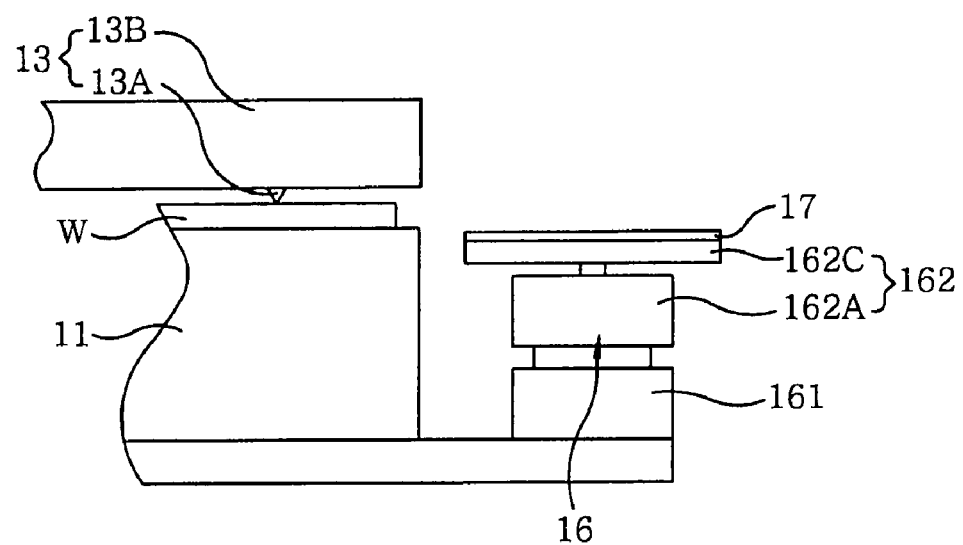

In order to perform the alignment, the wafer chuck 11 is moved in the X and Y directions. As illustrated in FIG. 6D, the CCD camera 13A detects the electrode pads corresponding to the probes 12A in a plurality of locations on the semiconductor wafer W. The XY-coordinate data of the respective electrode pads are stored in the storage unit 14B. The alignment between the probes 12A and the electrode pads of the semiconductor wafer W is completed through the series of above-described operations. After the alignment is completed, the wafer chuck 11 is moved to an inspection startup position and raised up at that position. Then, electrical characteristics are inspected by bringing the electrode pads of a first chip into contact with the probes 12A corresponding thereto, as can be seen from FIG. 7. Next, electrical characteristics are inspected for all of the chips of the semiconductor wafer W by index-feeding the semiconductor wafer W by the wafer chuck 11.

In order to eliminate the needle traces 17A of the needle trace transfer member 17, the needle trace transfer member 17 is heated by the heater 162D installed at the contact body 162C of the tip position detecting device 16 until the temperature thereof reaches a temperature higher than the glass transition temperature TG. In that state, the shape memory polymer changes rapidly from the glass state to the rubber state, and the needle traces 17A are eliminated in a short period of time, thereby recovering the flat surface. Accordingly, probes 12A of a new probe card 12 can be aligned.

As described above, in accordance with the present embodiment, before the electrical characteristics of the semiconductor wafer W are inspected by bringing the probes 12A into electrical contact with the semiconductor wafer W on the movable wafer chuck 11, the needle traces 17A of the probes 12A are transferred to the needle trace transfer member 17 to perform the alignment of the probes 12A. The needle trace transfer member 17 installed at the wafer chuck 11 is made of a shape memory polymer which is transformed reversibly and rapidly between a glass state with a high modulus of elasticity and a rubber state with a low modulus of elasticity near the glass transition temperature TG. Therefore, the needle traces 17A are transferred to the needle trace transfer member 17 within the temperature range of the glass state which is close to the temperature of the wafer chuck 11, and are eliminated in a short period of time within the temperature range of the rubber state which is slightly higher than the temperature of the wafer chuck 11. Since the temperature difference between the temperature at which the needle traces 17A are maintained and the temperature at which the needle traces 17A are eliminated is small, the needle traces 17A can be eliminated in a short period of time. As a result, the throughput can be improved.

Moreover, in accordance with the present embodiment, since the glass transition temperature of the shape memory polymer is close to the set temperature of the wafer chuck 11, it is possible to suppress the temperature decrease of the semiconductor wafer W by the temperature of the needle trace transfer member 17 even at the high-temperature inspection, and also possible to improve the reliability of the inspection by maintaining the in-plane temperature uniformity of the semiconductor wafer W. Further, due to the use of polyurethane-based resin for the shape memory polymer, the shape memory polymer having a desired glass transition temperature TG can be selected in accordance with the inspection temperature of the semiconductor wafer W. Furthermore, the probes 12A can be made to contact with the needle trace transfer member 17 at an optimum modulus of elasticity by properly changing the temperature of the needle trace transfer member 17 at which the needle traces are transferred thereto depending on types of the probes 12A.

On the contrary, when the needle trace transfer member is made of polyolefin or polyvinyl chloride as in the conventional case, the temperature difference between the temperature at which the needle traces 17A are maintained and the temperature of the wafer chuck is large, and the reliability of the inspection may deteriorate. Further, the temperature difference between the temperature at which the needle traces are maintained and the temperature at which the needle traces are eliminated is large, and time is required to increase the temperature to the point at which the needle traces are eliminated. Even when the temperature reaches the point at which the needle traces are eliminated, such temperature should be maintained for at least, e.g., one minute. For that reason, considerable time is spent until the needle traces are eliminated, which deteriorates the throughput.

The present invention is not limited to the above embodiment, and the components thereof may be properly modified if necessary. For example, in the above embodiment, a shape memory polymer using polyurethane-based resin is used for the needle trace transfer member. However, if necessary, another shape memory polymer may be properly selected and used. Further, although the shape memory polymer is directly provided at the contact body 162C in the above embodiment, a shape memory polymer laminated on a resin substrate may be provided at the contact body. Moreover, the needle trace transfer member may be provided at a simple supporting table, not at the tip position detecting device. In addition, another polymer other than the shape memory polymer may be used as long as it is transformed reversibly and rapidly between a glass state and a rubber state.

The present invention is suitable for a probe apparatus for inspecting electrical characteristics of a target object such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. A needle trace transfer member, installed at a movable mounting table, to which needle traces of probes are transferred to align the probes before electrical characteristics of a target object on the mounting table are inspected by bringing the probes into electrical contact with the target object, wherein the needle trace transfer member is made of a shape memory polymer transformed reversibly and rapidly between a glass state with a high modulus elasticity and a rubber state with a low modulus of elasticity near its glass transition temperature, wherein the needle trace transfer member is repeatedly usable by transferring the needle traces at a temperature lower than the glass transition temperature and eliminating the needle traces at a temperature higher than the glass transition temperature.

2. The needle trace transfer member of claim 1, wherein the glass transition temperature is set to a temperature close to a set temperature of the mounting table during a high-temperature inspection of the target object.

3. The needle trace transfer member of claim 2, wherein the shape memory polymer is mainly made of polyurethane-based resin.

4. The needle trace transfer member of claim 1, wherein the shape memory polymer is mainly made of polyurethane-based resin.

5. A probe apparatus for aligning a plurality of probes by picking up images of needle traces of the probes which are transferred to a needle trace transfer member on a support attached to a movable mounting table by an image pick-up device before electrical characteristics of a target object are inspected by bringing the probes disposed above the mounting table into electrical contact with the target object mounted on the mounting table, wherein the needle trace transfer member is made of a shape memory polymer transformed reversibly and rapidly between a glass state with a high modulus elasticity and a rubber state with a low modulus of elasticity near its glass transition temperature, wherein the needle trace transfer member is repeatedly usable by transferring the needle traces at a temperature lower than the glass transition temperature and eliminating the needle traces at a temperature higher than the glass transition temperature.

6. The probe apparatus of claim 5, wherein the glass transition temperature is set to a temperature close to a set temperature of the mounting table during a high-temperature inspection of the target object.

7. The probe apparatus of claim 6, wherein the shape memory polymer is mainly made of polyurethane-based resin.

8. The probe apparatus of claim 7, wherein the support has a temperature control unit for controlling a temperature of the shape memory polymer.

9. The probe apparatus of claim 6, wherein the support has a temperature control unit for controlling a temperature of the shape memory polymer.

10. The probe apparatus of claim 5, wherein the shape memory polymer is mainly made of polyurethane-based resin.

11. The probe apparatus of claim 10, wherein the support has a temperature control unit for controlling a temperature of the shape memory polymer.

12. The probe apparatus of claim 5, wherein the support has a temperature control unit for controlling a temperature of the shape memory polymer.

* * * * *